United States Patent
Lee et al.

(10) Patent No.: US 9,558,794 B2
(45) Date of Patent: Jan. 31, 2017

(54) SEMICONDUCTOR MEMORY DEVICE INCLUDING PERIPHERAL CIRCUIT FOR PERFORMING PROGRAM AND READ OPEARTIONS AND OPERATING METHOD THEREOF

(71) Applicant: SK hynix Inc., Gyeonggi-do (KR)

(72) Inventors: Won Hee Lee, Chungcheongbuk-do (KR); Ho Seok Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/918,327

(22) Filed: Oct. 20, 2015

(65) Prior Publication Data

US 2016/0343414 A1    Nov. 24, 2016

(30) Foreign Application Priority Data

May 20, 2015   (KR) .................. 10-2015-0070546

(51) Int. Cl.
| | | |
|---|---|---|
| *G11C 16/04* | (2006.01) | |
| *G11C 7/00* | (2006.01) | |
| *G11C 11/56* | (2006.01) | |
| G11C 16/10 | (2006.01) | |
| G11C 16/26 | (2006.01) | |

(52) U.S. Cl.
CPC .............. *G11C 7/00* (2013.01); *G11C 11/5642* (2013.01); *G11C 11/5628* (2013.01); *G11C 16/10* (2013.01); *G11C 16/26* (2013.01)

(58) Field of Classification Search
CPC .  G11C 16/0483; G11C 16/10; G11C 11/5628; G11C 11/5642; G11C 16/26
USPC ................................... 365/185, 12, 185.03, 185.17–185.19,365/185.22
See application file for complete search history.

(56) References Cited

U.S. PATENT DOCUMENTS

| | | | | |
|---|---|---|---|---|
| 8,385,115 | B2* | 2/2013 | Lee ................ | G11C 16/0483 365/185.02 |
| 8,817,540 | B2* | 8/2014 | Lee ................ | G11C 16/0483 365/185.14 |
| 9,286,987 | B1* | 3/2016 | Dong .............. | G11C 16/10 |
| 2014/0347935 | A1* | 11/2014 | Kim ............... | G11C 11/5642 365/185.17 |

FOREIGN PATENT DOCUMENTS

| | | |
|---|---|---|
| KR | 1020090106897 | 10/2009 |
| KR | 1020130022228 | 3/2013 |
| KR | 1020130034533 | 4/2013 |
| KR | 1020130072084 | 7/2013 |

* cited by examiner

*Primary Examiner* — David Lam
(74) *Attorney, Agent, or Firm* — IP & T Group LLP (57) ABSTRACT

A semiconductor memory device includes a memory cell array including a plurality of pages; a peripheral circuit suitable for performing a program operation and a read operation on the memory cell array; and a control logic suitable for controlling the peripheral circuit to apply first and second pass voltages respectively to first and second word lines adjacent to a selected word line during a program verify operation or the read operation.

14 Claims, 8 Drawing Sheets

SEMICONDUCTOR MEMORY DEVICE INCLUDING PERIPHERAL CIRCUIT FOR PERFORMING PROGRAM AND READ OPEARTIONS AND OPERATING METHOD THEREOF

CROSS-REFERENCE TO RELATED APPLICATION

The present application claims priority to Korean patent application number 10-2015-0070546, filed on May 20, 2015, in the Korean Intellectual Property Office, the entire disclosure of which is herein incorporated by reference in its entirety.

BACKGROUND

1. Field

An embodiment of the present disclosure relates to an electronic device, and more particularly, to a semiconductor memory device and an operating method thereof.

2. Description of the Related Art

Semiconductor memory devices are generally classified into volatile memory devices and nonvolatile memory devices.

Non-volatile memory devices perform read/write operations at relatively low speed, but retain stored data even without a constant source of power. Accordingly, non-volatile memory devices are used in situations where data needs to be stored without a constant source of power. Examples of non-volatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), and the like. Flash memories are classified into NOR type flash memories and NAND type flash memories.

Flash memories have an advantage of RAM in that data is freely programmed and erased, and advantages of ROM in which stored data is retained even without a constant source of power. Flash memories are widely used as storage mediums of portable electronic devices such as digital cameras, personal digital assistants (PDA), and MP3 players.

SUMMARY

Embodiments provide a semiconductor memory device and an operating method thereof, which can prevent a disturbance phenomenon during a read operation and a program verify operation.

According to an embodiment of the present disclosure, there is provided a semiconductor memory device, including: a memory cell array including a plurality of pages; a peripheral circuit suitable for performing a program operation and a read operation on the memory cell array; and a control logic suitable for controlling the peripheral circuit to apply first and second pass voltages respectively to first and second word lines adjacent to a selected word line during a program verify operation or the read operation.

According to an embodiment of the present disclosure, there is provided a program operation method of a semiconductor memory device, including: applying a program voltage to a word line selected from a plurality of word lines coupled to a memory cell array including a plurality of pages; and performing a program verify operation on a page coupled to the selected word line. The program verify operation may include: applying a verify voltage to the selected word line; and applying first and second pass voltage respectively to first and second word lines adjacent to the selected word line.

According to an embodiment of the present disclosure, there is provided a read operation method of a semiconductor memory device, including: applying a read voltage to a word line selected from a plurality of word lines coupled to a memory cell array including a plurality of pages; and applying first and second pass voltages respectively to first and second word lines adjacent to the selected word line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "between" two elements, it can be the only element between the two elements, or one or more intervening elements may also be present. Like reference numerals refer to like elements throughout.

DETAILED DESCRIPTION

In the following detailed description, embodiments will be described. As those skilled in the art would realize, the embodiments may be modified in various ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component.

Figure 1:
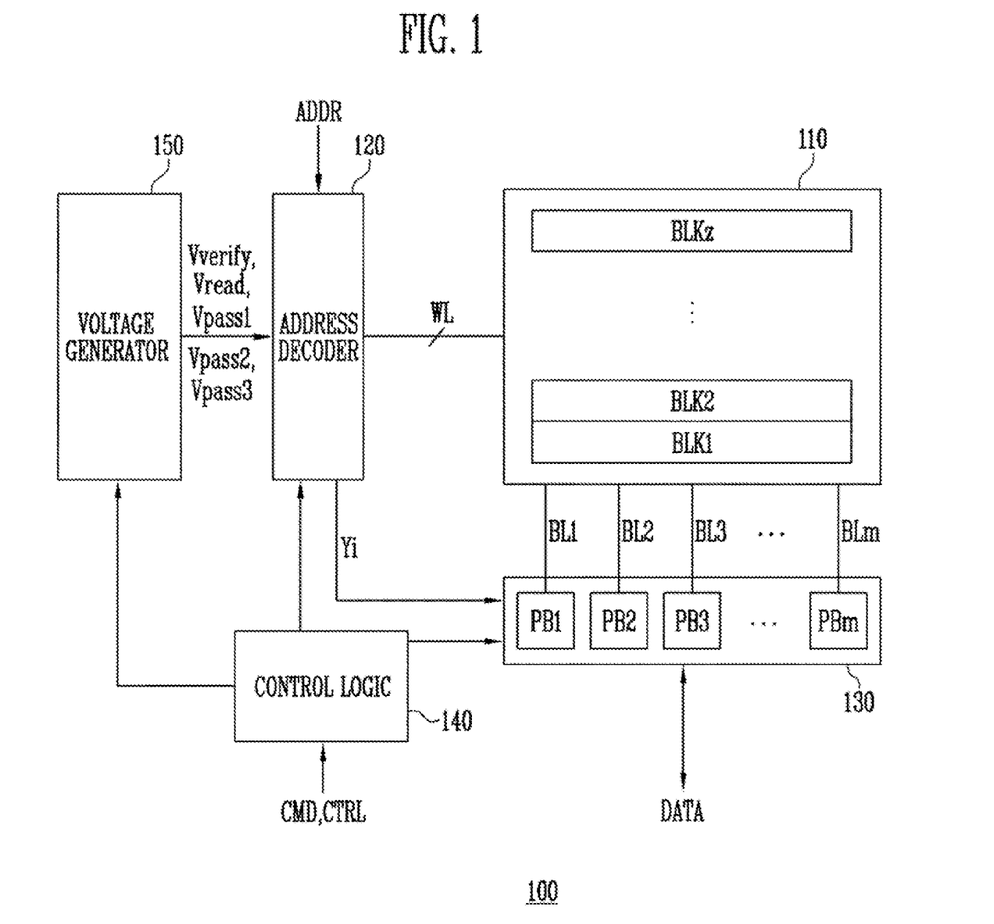
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130. Each of the plurality of memory blocks BLK1 to BLKz includes a plurality of memory cells. In an embodiment, the plurality of memory cells are nonvolatile memory cells. Among the plurality of memory cells, the memory cells coupled to a single word line are defined as a single page. That is, the memory cell array 110 is configured with a plurality of pages.

Each of the plurality of memory blocks BLK1 to BLKz in the memory cell array 110 includes a plurality of cell strings. Each of the plurality of cell strings includes a drain select transistor, a plurality of memory cells, and a source select transistor, which are coupled in series between a bit line and a source line. The memory cell array 110 will be described in detail later.

The address decoder 120, the read/write circuit 130, and the voltage generator 150 operate as peripheral circuits for driving the memory cell array 110.

The address decoder 120 is coupled to the memory cell array 110 through the word lines WL. The address decoder 120 operates under the control of the control logic. The address decoder 120 receives an address ADDR through an input/output buffer (not shown) inside the semiconductor memory device 100.

The address decoder 120 decodes a row address of an address ADDR provided during a program operation, and applies a program voltage, first to third pass voltages Vpass1, Vpass2, and Vpass3, a verify voltage Vverify or a read voltage Vread, and a plurality of operation voltages, which are generated from the voltage generator 150, to the plurality of memory cells and the drain and source select transistors in the memory cell array 110 according to the decoded row address.

The address decoder 120 decodes a column address of an address ADDR provided during a program operation and a read operation. The address decoder 120 transmits the decoded column address Yi to the read/write circuit 130.

The semiconductor memory device 100 may perform the program operation and the read operation of the semiconductor memory device 100 in units of pages. Also, the semiconductor memory device 100 may perform a single page program/read operation of programming or reading only a single page among a plurality of pages included in a memory block.

The address ADDR provided during the program operation and the read operation includes a block address, a row address, and a column address. The address decoder 120 selects one memory block and one word line according to the block address and the row address. The address decoder 120 may decode and provide the column address to the read/write circuit 130.

The address decoder 120 may include a block decoder, a row decoder, an address buffer, and the like.

The read/write circuit 130 includes a plurality of page buffers PB1 to PBm. The plurality of page buffers PB1 to PBm are coupled to the memory cell array 110 through bit lines BL1 to BLm. Each of the plurality of page buffers PB1 to PBm controls a potential of a corresponding bit line BL1 to BLm according to data DATA to be programmed when a program voltage applied during the program operation. Also, each of the plurality of page buffers PB1 to PBm senses a potential or current of the corresponding bit line BL1 to BLm thereby performing a verify operation during the program operation. Also, each of the plurality of page buffers PB1 to PBm senses a potential or current of the corresponding bit line BL1 to BLm thereby latching data DATA and then outputting the latched data DATA to the outside during the read operation.

The read/write circuit 130 operates under the control of the control logic 140.

As an exemplary embodiment, the read/write circuit 130 may include page buffers (or page registers), a column select circuit, and the like.

The control logic 140 is coupled to the address decoder 120, the read/write circuit 130, and the voltage generator 150. The control logic 140 receives a command CMD and a control signal CTRL through the input/output buffer (not shown) inside the semiconductor memory device 100. The control logic 140 controls overall operations of the semiconductor memory device 100 in response to the command CMD and the control signal CTRL.

During the program verify operation or the read operation of all pages included in a selected memory block, the control logic 140 may control the voltage generator 150 and the address decoder 120 to apply, to unselected word lines bilaterally adjacent to a selected word line, a pass voltage higher than that applied to the other unselected word lines. Also, during the program verify operation or the read operation of one of a plurality of pages included in a selected memory block, the control logic 140 may control the voltage generator 150 and the address decoder 120 to apply different pass voltages to the unselected word lines bilaterally adjacent to the selected word line.

For example, during the single page program/read operation, the first pass voltage Vpass1 is applied to the unselected word line adjacent the selected word line in the direction of a source select transistor, and the second pass voltage Vpass2 is applied to an unselected word line adjacent to the selected word line in the direction of a drain select transistor. Also, the third pass voltage Vpass3 is applied to remaining unselected word lines other than the unselected word lines adjacent to selected word line. The first pass voltage Vpass1 may be lower than the second pass voltage Vpass2, and the third pass voltage Vpass3 may be lower than the first pass voltage Vpass1.

The voltage generator 150 generates the program voltage, the verify voltage Vverify, the read voltage Vread, first to third pass voltages Vpass1, Vpass2, and Vpass3, and the plurality of operation voltages according to control of the control logic 140 when program and read operations are performed. The first pass voltage Vpass1 may be lower than the second pass voltage Vpass2, and the third pass voltage Vpass3 may be lower than the first pass voltage Vpass1.

Figure 2:
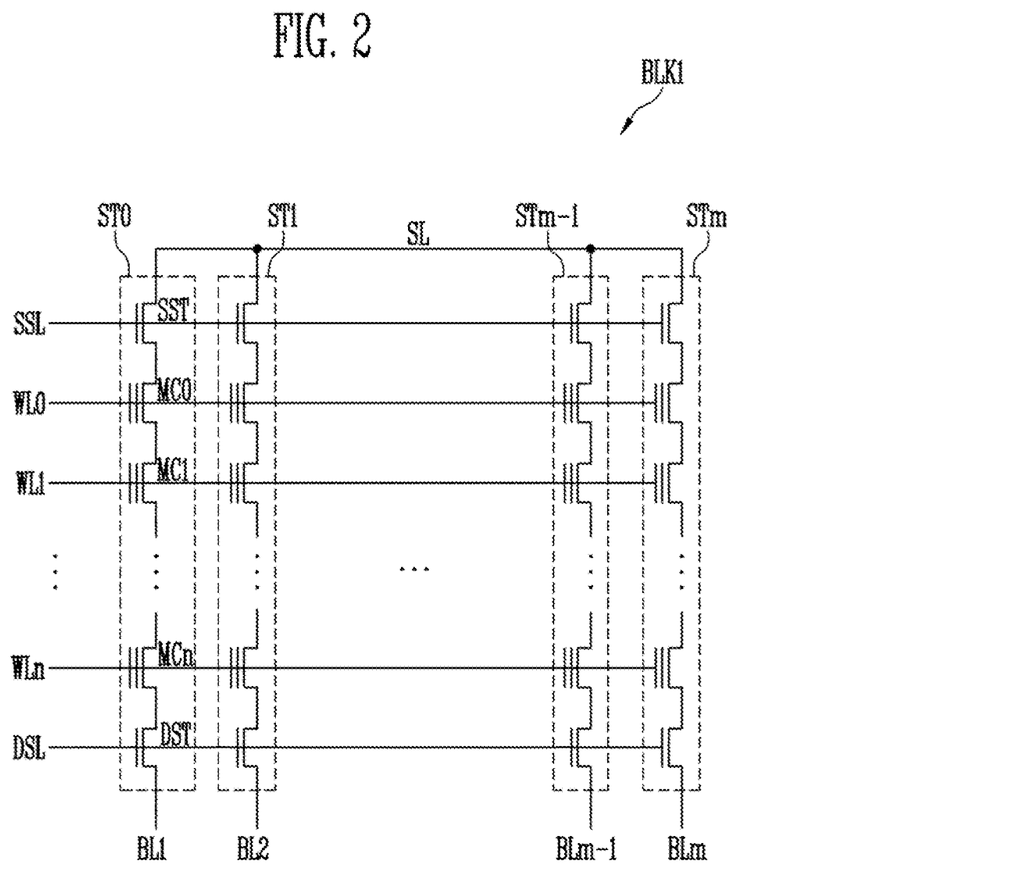
FIG. 2 is a circuit diagram illustrating a memory block of FIG. 1.

FIG. 2 is a circuit diagram illustrating one memory block BLK1 among the plurality of memory blocks shown in FIG. 1.

Referring to FIG. 2, the memory block BLK1 includes a plurality of cell strings ST0 to STm. The plurality of cell strings ST0 to STm are coupled to a plurality of bit lines BL0 to BLm, respectively.

Each of the plurality of cell strings ST0 to STm includes a source select transistor SST, a plurality of memory cells MC0 to MCn coupled in series, and a drain select transistor DST. The source select transistor SST is coupled to a source select line SSL. The plurality of memory cells MC0 to MCn are coupled to word lines WL0 to WLn, respectively. The drain select transistor DST is coupled to a drain select line DSL. A source line SL is coupled to a source of the source select transistor SST. Each of the bit lines BL1 to BLm is coupled to a drain of a corresponding drain select transistor DST. The plurality of word lines WL include the source select line SSL, the word lines WL0 to WLn, and the drain select line DSL. The source select line SSL, the word lines WL0 to WLn, and the drain select line DSL are driven by the address decoder 120.

Figure 3:
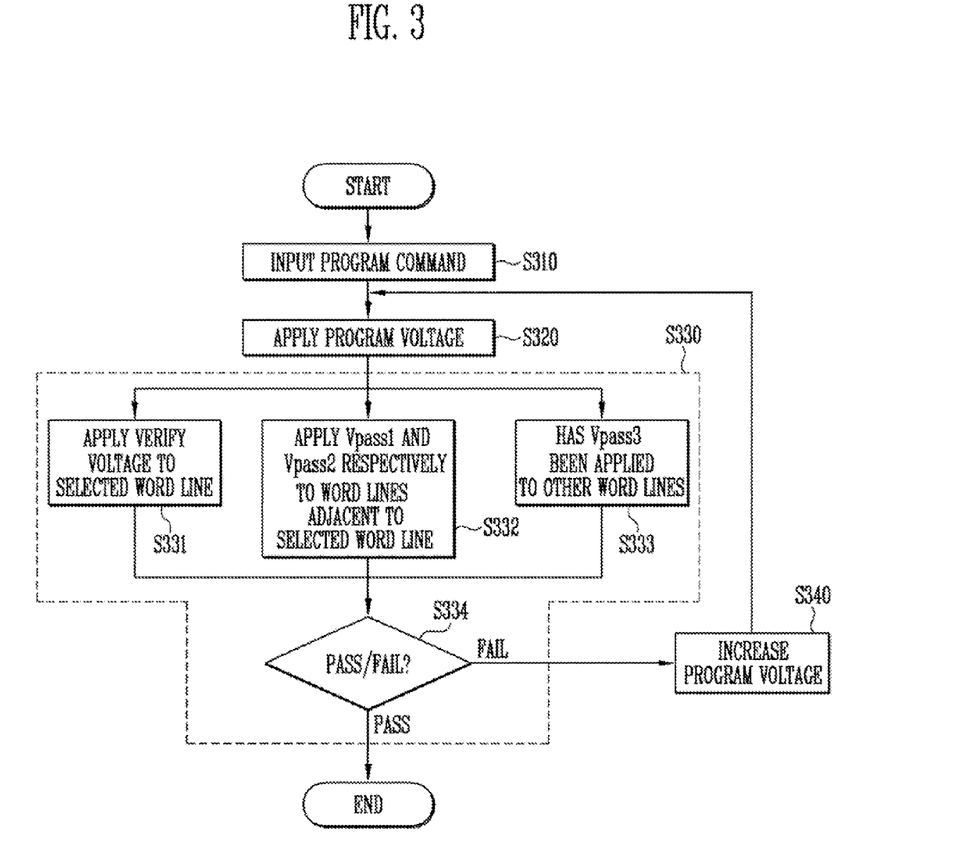
FIG. 3 is a flowchart Illustrating a program operation of the semiconductor memory device according to an embodiment of the present disclosure.

FIG. 3 is a flowchart illustrating the program operation of the semiconductor memory device according to an embodiment of the present disclosure.

Figure 4A:
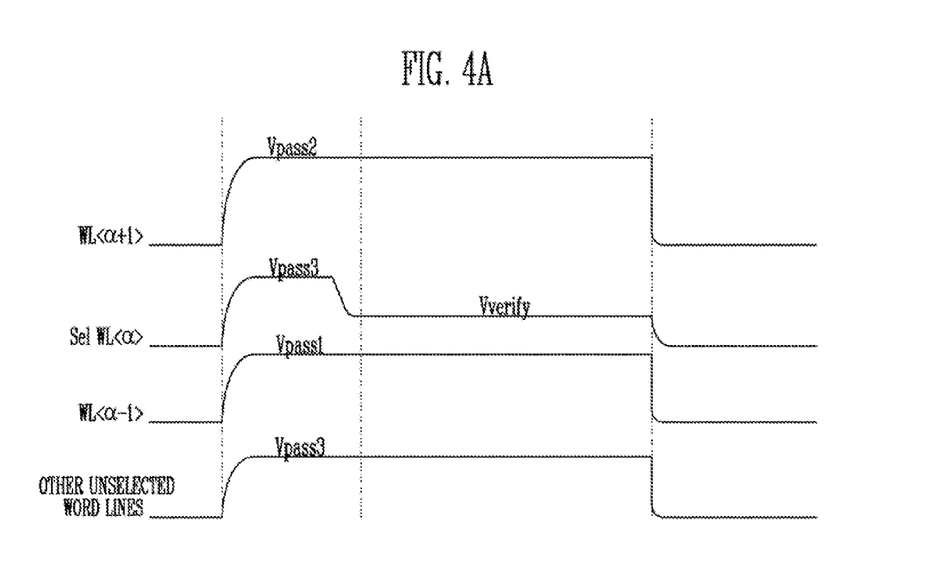
FIGS. 4A and 4B are waveform diagrams illustrating voltages applied to word lines during a program verify operation according to an embodiment of the present disclosure.
Figure 4B:
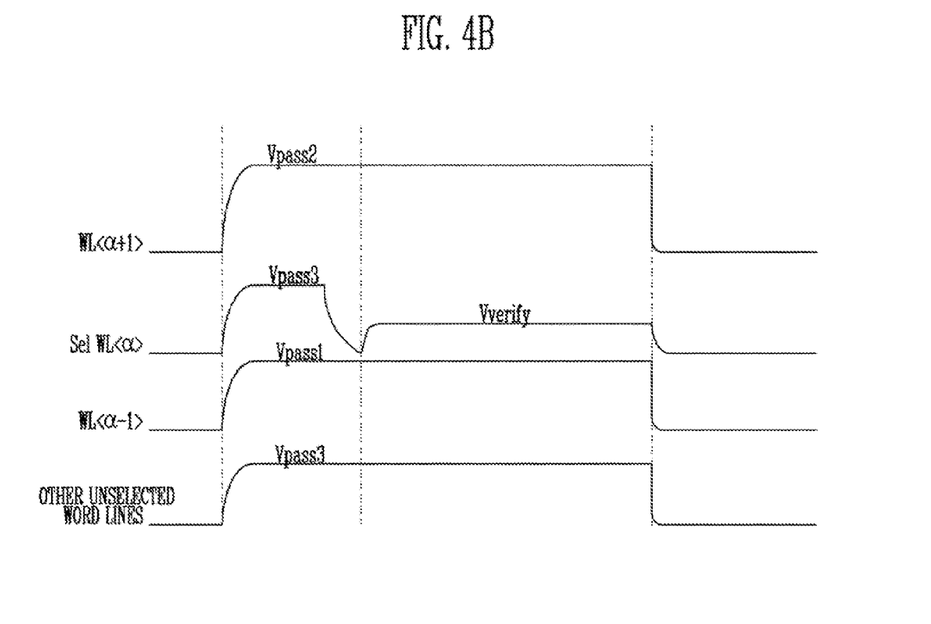

FIGS. 4A and 4B are waveform diagrams illustrating voltages applied to the word lines WL during the program verify operation according to an embodiment of the present disclosure.

The single page program operation of the semiconductor memory device according to an embodiment of the present disclosure will be described as follows with reference to FIGS. 1 to 4A.

1) Input of Program Command (S310)

Upon receiving a program command for a single page, the control logic 140 controls peripheral circuits to perform a single page program operation of the semiconductor memory device. The read/write circuit 130 temporarily stores data DATA to be programmed, which is input from the outside, and controls a potential level of the bit lines BL1 to BLm as a program permission voltage or a program prohibition voltage according to the stored data DATA.

2) Application of Program Voltage (S320)

The voltage generator 150 generates a program voltage to be applied to the selected word line and the third pass voltage Vpass3 to be applied to unselected word lines. Also, the voltage generator 150 generates an operation voltage to be applied to drain select line DSL and the source select line SSL together with the program voltage and the third pass voltage Vpass3.

The address decoder 120 selects a single word line for performing the single page program operation in response to the address signal ADDR and applies the program voltage generated by the voltage generator 150 to the selected word line.

3) Verify Operation (S330)

Upon completion of the application of the program voltage, a verify operation is performed on the selected memory cells. The verify operation will be described in detail as follows.

3-1) Application of Verify Voltage to Selected Word Line (S331)

The voltage generator 150 generates a verify voltage Vverify to be applied to the selected word line Sel WL<α>. The address decoder 120 applies the verify voltage Vverify to the selected word line Sel WL<α> to perform the single page program operation in response to the address signal ADDR. In this case, the third pass voltage Vpass3 may be applied to the selected word line Sel WL<α> before the verify voltage Vverify is applied.

3-2) Application of First and Second Voltages to Adjacent Word Lines (S332)

The voltage generator 150 generates the first pass voltage Vpass1 and the second pass voltage Vpass2 to be respectively applied to the unselected word lines WL<α−1> and WL<α+1> bilaterally adjacent to the selected word line Sel WL<α>, and the address decoder 120 applies the first pass voltage Vpass1 and the second pass voltage Vpass2 respectively to the unselected word lines WL<α−1> and WL<α+1>.

The unselected word line WL<α−1> among the unselected word lines WL<α−1> and WL<α+1> is coupled to a memory cell adjacent to the selected memory cell in the direction of the source select transistor SST, and the unselected word line WL<α+1> is coupled to a memory cell adjacent to the selected memory cell in the direction of the drain select transistor DST.

The first pass voltage Vpass1 may be lower than the second pass voltage Vpass2.

3-3) Application of Third Pass Voltage to Remaining Unselected Word Lines (S333)

The voltage generator 150 generates the third pass voltage Vpass3 to be applied to the remaining unselected word lines other than the adjacent and unselected word lines WL<α−1> and WL<α+1> among the plurality of word lines WL0 to WLn, and the address decoder 120 applies the third pass voltage Vpass3 to the remaining unselected word lines.

The third pass voltage Vpass3 may be lower than the first pass voltage Vpass1.

During the single page program operation, a channel of the memory cell coupled to the selected word line and the word line WL<α−1> adjacent to the selected word line in the direction of the source select line SSL is coupled to the source line SL having a ground potential level, thereby resulting in the disturbance phenomenon in which electrons are tunneled by the first pass voltage Vpass1 higher than the third pass voltage Vpass3, and therefore, the distribution of threshold voltages increases. Since only a single page is continuously selected and programmed during the single page program operation, the disturbance phenomenon consistently occurs on the memory cell coupled to the adjacent word line WL<α−1>, and therefore, the distribution of threshold voltages is gradually deteriorated. In order to prevent this, the first and second pass voltages Vpass1 and Vpass2 higher than the third pass voltage Vpass3 applied to the remaining unselected word lines are respectively applied to the unselected word lines WL<α−1> and WL<α+1> adjacent to the selected word line as described above. In this state, the first pass voltage Vpass1 applied to the unselected word line WL<α−1> adjacent to the selected word line in the direction of the source select line SSL is applied to be lower than the second pass voltage Vpass2 applied to the unselected word line WL<α+1> adjacent to the selected line in the direction of drain select line SSL, so that it is possible to improve the distribution of threshold voltages while preventing the disturbance phenomenon.

3-4) Determination of Verify Result (S334)

The read/write circuit 130 detects a program verify result by sensing a potential level or current amount of the bit lines BL0 to BLm, and transmits the detected program verify result to the control logic 140. When it is determined that all memory cells included in the selected page have been programmed, the control logic 140 ends the program operation.

4) Increasing of Program Voltage (S340)

When it is determined that at least one memory cell has not been programmed at step S334, the program voltage is increased, and the program operation is again performed from step S320.

Referring to FIG. 4B, at step S331, the third pass voltage Vpass3 applied to the selected word line Sel WL<α> is discharged to a ground voltage, and the verify voltage Vverify is then applied to the selected word line Sel WL<α>. Accordingly, during the verify operation, it is possible to prevent the potential level of the selected word line Sel WL<α> higher than the verify voltage Vverify through the third pass voltage Vpass3 applied to the selected word line Sel WL<α> before step S331.

Figure 5:
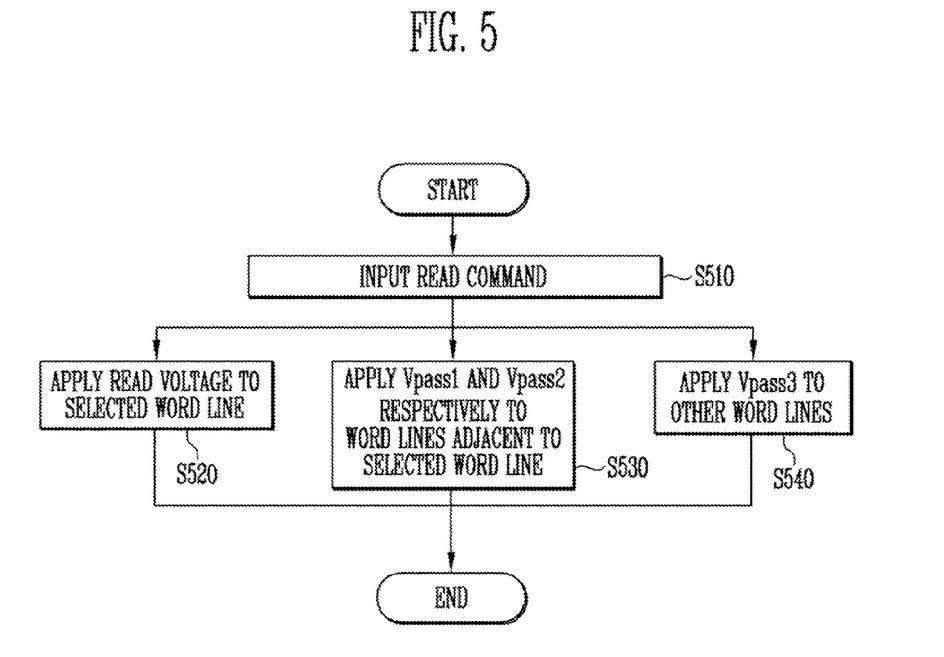
FIG. 5 is a flowchart illustrating a read operation of the semiconductor memory device according to an embodiment of the present disclosure.

FIG. 5 is a flowchart Illustrating a read operation of the semiconductor memory device according to an embodiment of the present disclosure.

Figure 6A:
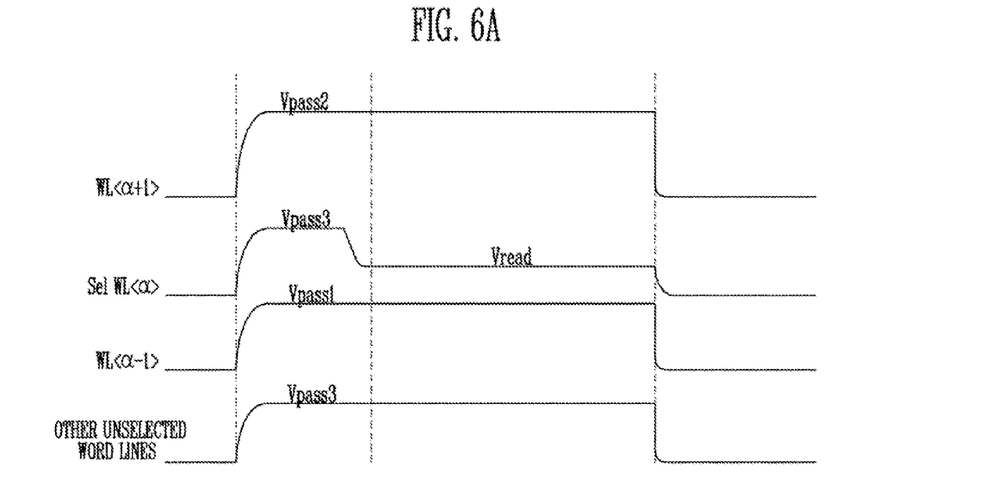
FIGS. 6A and 6B are waveform diagrams illustrating voltages applied to word lines during a read operation according to an embodiment of the present disclosure.
Figure 6B:
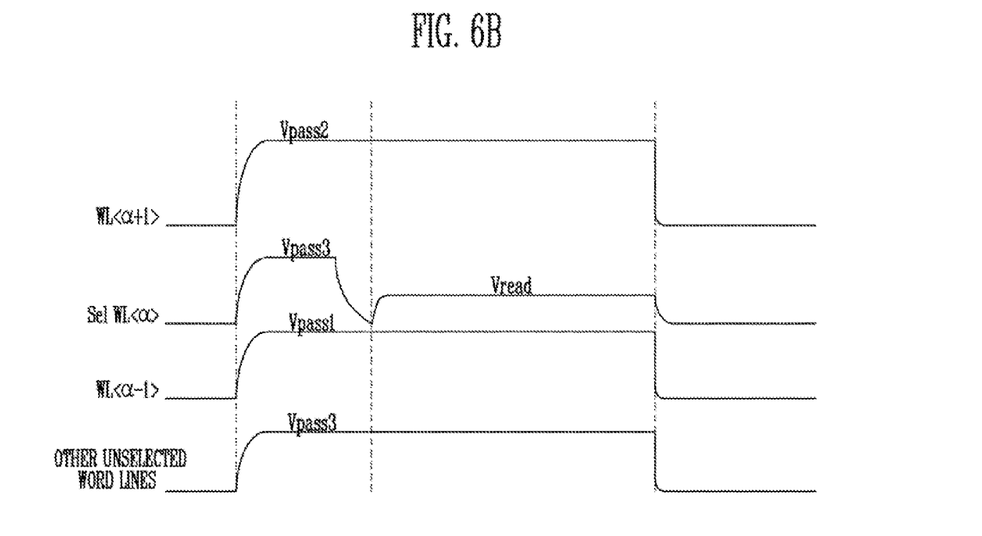

FIGS. 6A and 6B are waveform diagrams illustrating voltages applied to the word lines WL during the read operation according to an embodiment of the present disclosure.

The signal page read operation of the semiconductor memory device according to an embodiment of the present disclosure will be described as follows with reference to FIGS. 1, 2, 5, and 6A.

1) Input of Read Command (S510)

Upon receiving a read command for a single page, the control logic 140 controls peripheral circuits to perform a single page read operation of the semiconductor memory device.

2) Application of Read Voltage to Selected Word Line (S520)

The voltage generator 150 generates a read voltage Vread to be applied to the selected word line Sel WL<o>. The address decoder 120 applies the read voltage Vread to the selected word line Sel WL<α> so as to perform a single page read operation in response to an address signal ADDR. In this case, a third pass voltage Vpass3 may applied to the selected word line Sel WL<o> before a verify voltage Vverify is applied.

3) Application of First Pass Voltage and Second Pass Voltage to Adjacent Word Lines (S530)

The voltage generator 150 generates the first pass voltage Vpass1 and the second pass voltage Vpass2 to be respectively applied to the unselected word lines WL<α−1> and WL<α+1> bilaterally adjacent to the selected word line Sel WL<α>, and the address decoder 120 applies the first pass voltage Vpass1 and the second pass voltage Vpass2 respectively to the unselected word lines WL<α−1> and WL<α+1>.

The unselected word line WL<α−1> among the unselected word lines WL<α−1> and WL<α+1> is coupled to a memory cell adjacent to the selected memory cell in the direction of the source select transistor SST, and the unselected word line WL<α+1> is coupled to a memory cell adjacent to the selected memory cell in the direction of the drain select transistor DST.

The first pass voltage Vpass1 may be lower than the second pass voltage Vpass2.

4) Application of Third Pass Voltage to Other Word Lines (S540)

The voltage generator 150 generates the third pass voltage Vpass3 to be applied to the remaining unselected word lines other than the adjacent and unselected word lines WL<α−1> and WL<α+1> among the plurality of word lines WL0 to WLn, and the address decoder 120 applies the third pass voltage Vpass3 to the remaining unselected word lines.

The third pass voltage Vpass3 may be lower than the first pass voltage Vpass1.

During the single page read operation, a channel of the memory cell coupled to the selected word line and the word line WL<α−1> adjacent to the selected word line in the direction of the source select line SSL is coupled to the source line SL having a ground potential level, thereby resulting in the disturbance phenomenon in which electrons are tunneled by the first pass voltage Vpass1 higher than the third pass voltage Vpass3, and therefore, the distribution of threshold voltages increases. Since only a single page is continuously selected and read during the single page read operation, the disturbance phenomenon consistently occurs on the memory cell coupled to the adjacent word line WL<α−1>, and therefore, the distribution of threshold voltages is gradually deteriorated. In order to prevent this, the first and second pass voltages Vpass1 and Vpass2 higher than the third pass voltage Vpass3 applied to the remaining unselected word lines are respectively applied to the unselected word lines WL<α−1> and WL<α+1> adjacent to the selected word line as described above. In this state, the first pass voltage Vpass1 applied to the unselected word line WL<α−1> adjacent to the selected word line in the direction of the source select line SSL is applied to be lower than the second pass voltage Vpass2 applied to the unselected word line WL<α+1> adjacent to the selected line in the direction of drain select line DSL, so that it is possible to improve the distribution of threshold voltages while preventing the disturbance phenomenon.

Referring to FIG. 6B, at step S520, the third pass voltage Vpass3 applied to the selected word line Sel WL<α> is discharged to a ground voltage, and the read voltage Vread is then applied to the selected word line Sel WL<α>. Accordingly, during the read operation, it is possible to prevent the potential level of the selected word line Sel WL<α> higher than the read voltage Vread through the third pass voltage Vpass3 applied to the selected word line Sel WL<α> before step S520.

In the embodiments of the present disclosure, the single page program/read operations have been described as examples. However, the above-described technique may also be applied to an operation of programming or reading all pages included in a memory block.

Figure 7:
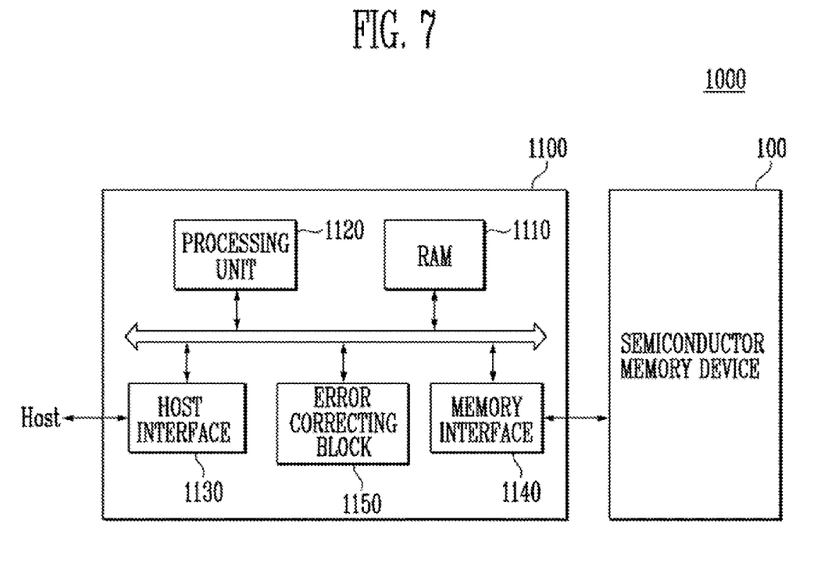
FIG. 7 is a block diagram illustrating a memory system including the semiconductor memory device of FIG. 1.

FIG. 7 is a block diagram Illustrating a memory system including the semiconductor memory device of FIG. 1.

Referring to FIG. 7, the memory system 1000 includes a semiconductor memory device 100 and a controller 1000.

The semiconductor memory device 100 is identical to the semiconductor memory device described with reference to FIG. 1. Hereinafter, overlapping descriptions will be omitted.

The controller 1000 is connected to a host Host and the semiconductor memory device 100. The controller 1000 is configured to access the semiconductor memory device 100 in response to a request from the host Host. For example, the controller 1000 is configured to control read, write, erase, and background operations of the semiconductor memory device 100. The controller 1000 is configured to provide an interface between the semiconductor memory device 100 and the host Host. The controller 1000 is configured to drive firmware for controlling the semiconductor memory device 100.

The controller 1000 includes a random access memory (RAM) 1110, a processing unit 1120, a host interface 1130, a memory interface 1140, and an error correcting block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls overall operations of the controller 1100. Also, the controller 1100 may arbitrarily store program data provided from the host Host when a read operation is performed.

The host interface 1130 includes a protocol for exchanging data between the host Host and the controller 1100. As an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correcting block 1150 is configured to detect and correct an error of data received from the semiconductor memory device 100 by using an error correcting code (ECC). The processing unit 1120 may adjust a read voltage based on an error detection result of the error correcting block 1150, and control the semiconductor memory device 100 to perform a re-read operation. As an exemplary embodiment, the error correcting block 1150 may be provided as a component of the controller 1100.

The controller 1100 and the semiconductor memory device 100 may be integrated into one semiconductor device. As an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host connected to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline Integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 8:
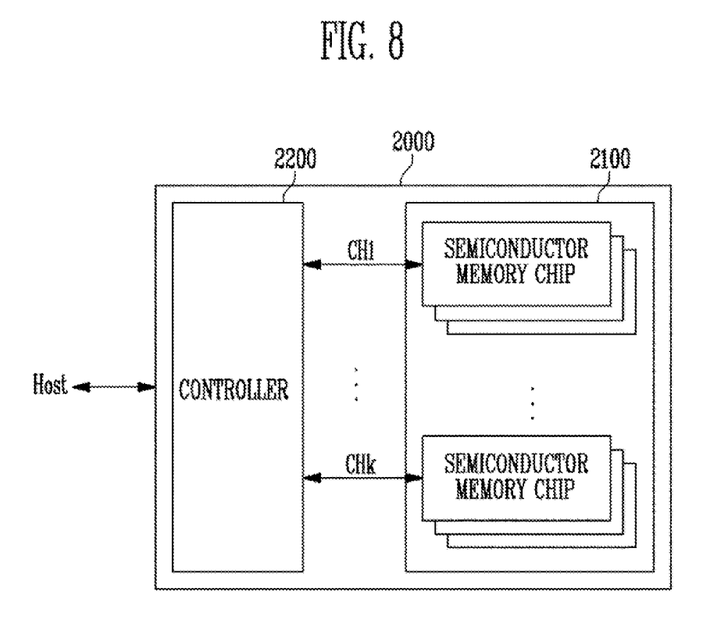
FIG. 8 is a block diagram illustrating an applied example of the memory system of FIG. 7.

FIG. 8 is a block diagram illustrating an applied example of the memory system of FIG. 7.

Referring to FIG. 8, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 8, it is illustrated that the plurality of groups communicate with the controller 2200 through first to kth channels CH1 to CHk. Each semiconductor memory chip may be configured and operate like the semiconductor memory devices 100 described with reference to FIG. 1.

Each group is configured to communicate with the controller 2200 through one common channel. The controller 2200 is configured similarly to the controller 1100 described with reference to FIG. 6. The controller 2200 is configured to control the plurality of memory chips of the semiconductor memory device 2100 through the plurality of channels CH1 to CHk.

Figure 9:
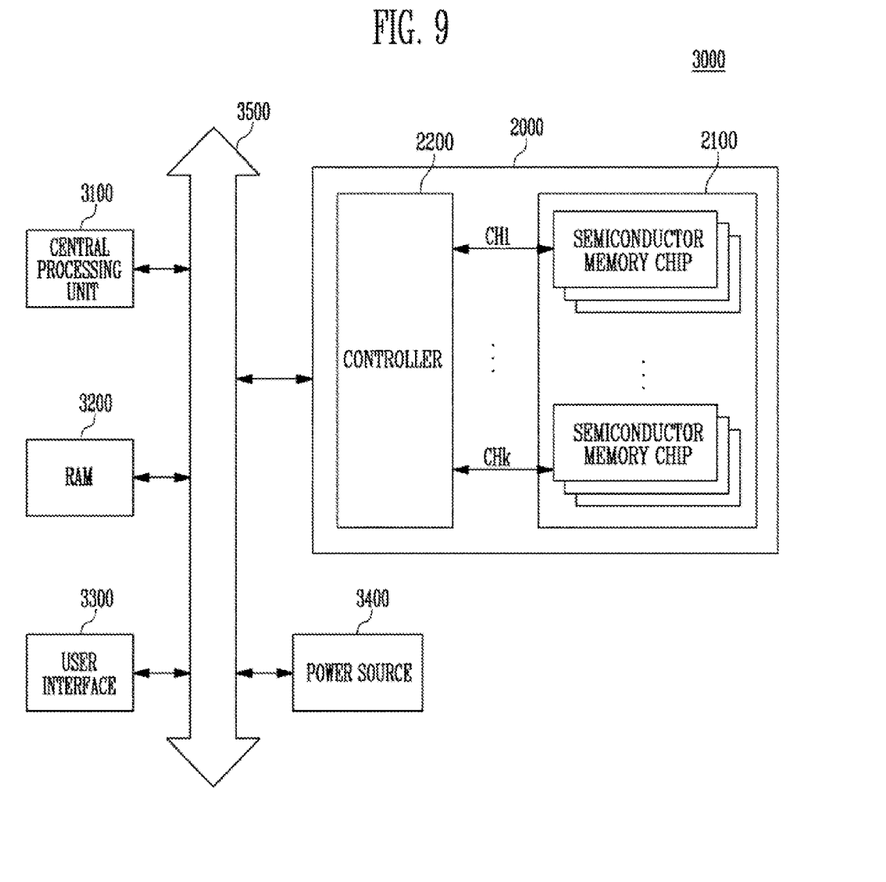
FIG. 9 is a block diagram illustrating a computing system including the memory system described with reference to FIG. 8.

FIG. 9 is a block diagram illustrating a computing system including the memory system described with reference to FIG. 8.

Referring to FIG. 10, the computing system 300 includes a central processing unit 3100, a RAM 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 9, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 9, it is illustrated that the memory system 2000 described with reference to FIG. 8 is provided. However, the memory system 2000 may be replaced by the memory system 1000 described with reference to FIG. 8. As an exemplary embodiment, the computing system 3000 may be configured to include both the memory systems 1000 and 2000 described with reference to FIGS. 7 and 8.

According to the present disclosure, when a read operation and a program verify operation of the semiconductor memory device are performed, different voltages are respectively applied to a selected word line and first and second word lines, so that it is possible to prevent a disturbance phenomenon when a single page operation is performed. Also, it is possible to improve the distribution of threshold voltages of memory cells.

Embodiments have been disclosed herein, and although specific terms are employed, they are used and are to be interpreted in a generic and descriptive sense only and not for limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
   a memory cell array including a plurality of pages;
   a peripheral circuit suitable for performing a program operation and a read operation on the memory cell array; and
   a control logic suitable for controlling the peripheral circuit to apply first and second pass voltages respectively to first and second word lines adjacent to a selected word line during a program verify operation or the read operation, wherein the control logic controls the peripheral circuit to apply a third pass voltage, having a lower potential than both the first and second pass voltages, to unselected word lines except for the selected word line and the first and second word lines.

2. The semiconductor memory device of claim 1, wherein the first word line is adjacent to the selected word line in the direction of a source select line.

3. The semiconductor memory device of claim 1, wherein the second word line is adjacent to the selected word line in the direction of a drain select line.

4. The semiconductor memory device of claim 1, wherein the first pass voltage has a lower potential than the second pass voltage.

5. The semiconductor memory device of claim 1, wherein the program operation is a single page program operation of performing a program operation on one page selected from the plurality of pages.

6. The semiconductor memory device of claim 1, wherein the read operation is a single page read operation of performing a read operation on one page selected from the plurality of pages.

7. A program operation method of a semiconductor memory device, comprising:
   applying a program voltage to a word line selected from a plurality of word lines coupled to a memory cell array including a plurality of pages; and
   performing a program verify operation on a page coupled to the selected word line,
   wherein the program verify operation includes:
   applying a verify voltage to the selected word line;
   applying first and second pass voltages respectively to first and second word lines adjacent to the selected word line; and
   applying a third pass voltage, having a lower potential than both the first and second pass voltages, to unselected word lines except for the selected word line and the first and second word lines among the plurality of word lines.

8. The program operation method of claim 7, wherein the first word line is adjacent to the selected word line in the direction of a source select line.

9. The program operation method of claim 7, wherein the second word line is adjacent to the selected word line in the direction of a drain select line.

10. The program operation method of claim 7, wherein the first pass voltage has a lower potential than the second pass voltage.

11. A read operation method of a semiconductor memory device, comprising:
    applying a read voltage to a word line selected from a plurality of word lines coupled to a memory cell array including a plurality of pages;
    applying first and second pass voltages that are different respectively to first and second word lines adjacent to the selected word line; and
    applying a third pass voltage, having a lower potential than both the first and second pass voltages, to unselected word lines except for the selected word line and the first and second word lines among the plurality of word lines.

12. The read operation method of claim 11, wherein the first word line is adjacent to the selected word line in the direction of a source select line.

13. The read operation method of claim 11, wherein the second word line is adjacent to the selected word line in the direction of a drain select line.

14. The read operation method of claim 11, wherein the first pass voltage has a lower potential than the second pass voltage.

* * * * *